United States Patent [19]

Parker

[11] Patent Number: 5,157,701
[45] Date of Patent: Oct. 20, 1992

[54] HIGH SPEED COUNTER CIRCUIT

[75] Inventor: Gary Parker, Mayfield Heights, Ohio

[73] Assignee: Allen-Bradley Company, Inc., Milwaukee, Wis.

[21] Appl. No.: 676,621

[22] Filed: Mar. 28, 1991

[51] Int. Cl.⁵ ............................................. G06F 7/02
[52] U.S. Cl. ...................................... 377/39; 377/54; 377/56
[58] Field of Search .............................. 377/39, 54, 56

[56] References Cited

U.S. PATENT DOCUMENTS

| | | | |
|---|---|---|---|
| 3,824,378 | 7/1974 | Johnson et al. | 377/39 |
| 4,305,123 | 12/1981 | Scibor-Rylski | 377/39 |
| 4,420,814 | 12/1983 | Arikawa et al. | 377/39 |
| 4,809,221 | 2/1989 | Magliocco et al. | 377/39 |

OTHER PUBLICATIONS

Allen-Bradley User's Manual "Encoder/Counter Module", Catalogue No. 1771-IJ,IK, 1981.

Primary Examiner—John S. Heyman
Attorney, Agent, or Firm—Quarles & Brady

[57] ABSTRACT

A high speed counter employs a number of functional blocks, flexibly interconnected on a bus structure, to provide efficient and high speed implementation of arbitrary range measuring tasks. A set of independent counters blocks are connected by the bus structure to programmable comparator blocks which establish count thresholds. The output of the comparators are paired by switchable AND/OR blocks to create ranges. The division of functions by block and the interconnecting bus structure allows the structure of each counter to be effectively programmed to fit the application at hand.

5 Claims, 6 Drawing Sheets

FIG. 9
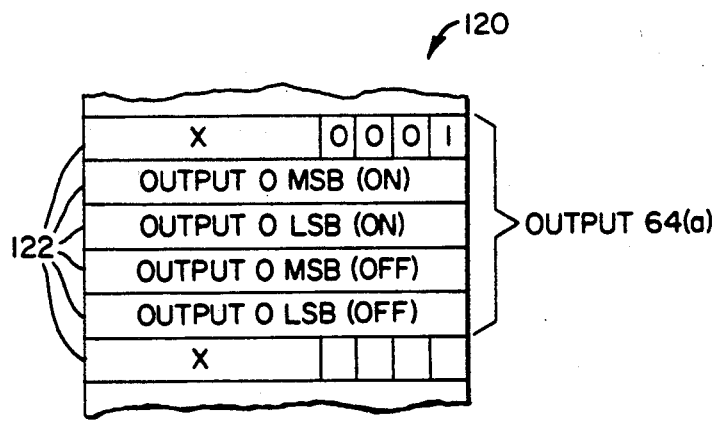
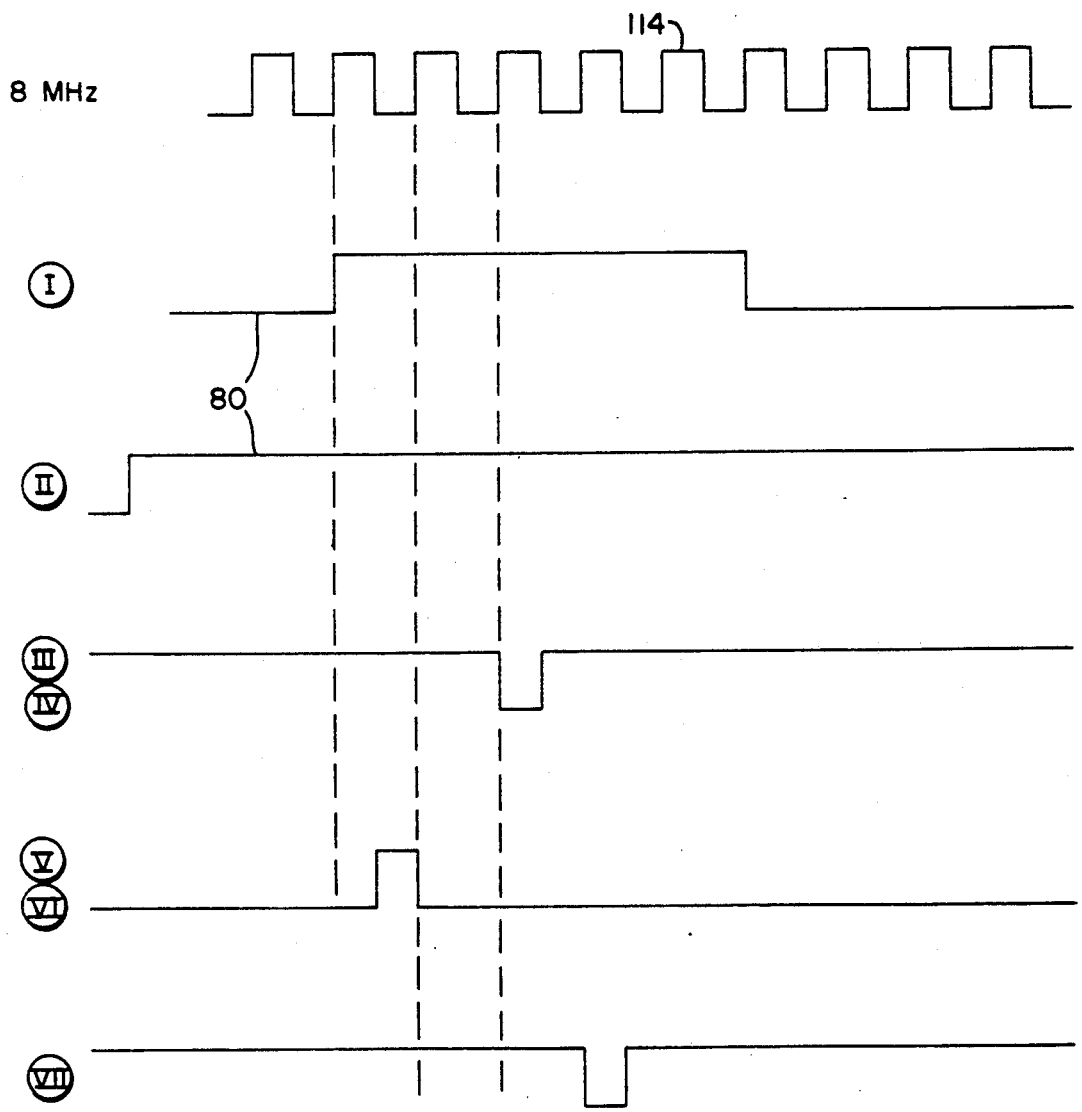
FIG. 10

HIGH SPEED COUNTER CIRCUIT

BACKGROUND OF THE INVENTION

1. Field of the Invention

The field of the invention is industrial control systems including programmable controllers, and more particularly, a high speed counter module used in conjunction with such industrial control systems.

2. Background Art

Industrial control systems such as those described in U.S. Pat. Nos. 3,810,118, 3,942,158, 4,165,534 and 4,442,504 are typically connected to industrial equipment such as assembly lines or machine tools, to operate such equipment in accordance with a stored program. The stored program, running on the central processing unit of the system, termed the "controller", includes instructions which, when executed, examine the condition of selected inputs to the system from sensing devices on the controlled equipment and energize or deenergize selected outputs from the system to operate devices on the controlled equipment.

Inputs to the system may be discrete binary signals such as those from switches, which may detect limits of process variables such as motion, temperature, time, or other quantities, or the inputs may be analog measures of the process variables themselves, which are generally then converted to digital binary form for processing. Likewise, the outputs of the system may be either binary outputs as implemented by mechanical or solid state relays, or analog outputs produced by means of a digital to analog converter.

A process variable, such the number of items moving along an assembly line, may be counted by the controller by means of a sensing device which sets and resets a single digital input to the controller for each passing item. The changes in that input may be tallied by means of the program running in the controller.

This approach to counting has two significant drawbacks. The first is that only relatively low count rates may be supported by the controller. Typically, the inputs and outputs of the controller are "scanned" one at a time, the state of each output and input being sequentially written to or read during each scanning cycle. If the counting rate is higher than the scanning rate, some "counts" will be lost.

For many applications, and in particular, those applications where the items to be counted are pulses from a high resolution encoder or the like, the limit imposed by the scanning rate will be unacceptably low. Further, because the actual scan rate varies depending on how many inputs and outputs must be scanned, the maximum count rate must be given an additional margin of reduction to ensure reliable counting under a "worst case" analysis of scan time. Such worst case analysis must take into account possible future expansion of the controls system to include additional inputs and outputs.

The second drawback to the above approach to counting is that the controller is diverted from other control tasks by the need to repeatedly examine the particular input being counted and to execute a portion of its program to count that input signal.

Accordingly, it is known to use a separate binary counter module communicating with the controller to independently count such process variables. The binary count produced by the counter may then be read by the controller on a less frequent basis to determine if a given count has been reached.

An improvement to the use of separate counter module is the combining of a counter with one or more comparators to constantly evaluate the count against threshold values and to produce a binary signal indicating whether or not the count has exceeded the threshold value. This use of the comparator frees the controller from repeatedly loading the multi-bit count and comparing it to a threshold value in its program. Rather, the comparator allows the controller to examine only the single bit of the comparator's output representing the state of the count with respect to the threshold value.

With more complex systems it may become necessary to evaluate the count of a counter against a number of thresholds. For example, it may be desirable that the program running in the controller execute a first task when the count reaches a first value and execute a second task only if the count reaches a second value and so forth. This may be accomplished by wiring several comparators to each counter so that different thresholds may be established.

Ultimately, the disadvantage of implementing the counting function in "hardware", (that is discrete circuity), rather than through the "software" of the controller, is that the counting function is much less flexible. The number of threshold values is fixed by the counter circuitry and cannot be increased as the application may demand. For this reason it is the practice to provide each counter with a number of extra comparators for producing additional thresholds. Counters having as many as four different threshold values are commercially available, but even this number may be too little for some applications. Further, the extra cost of the unused threshold circuitry may be significant in cases where only one threshold value is needed.

SUMMARY OF THE INVENTION

The present invention provides the counting speed associated with a "hardware" implementation of the counting function, and yet provides much of the flexibility normally associated with a "software" implementation of the counting function. This is accomplished by dividing the counting function into a number of discrete logical units which are implemented in hardware and joined by a programmable bus structure to allow the various logical units to be flexibly interconnected. The result is that the counter of the present invention may be programmably configured efficiently to fill the needs of a number of counting applications.

Specifically, a set of independent counters provides a counter output to a bus. Multiplexers receive the counter outputs from the bus and communicate one counter output to the input of one digital comparator of a set of digital comparators corresponding in number to the multiplexers. The other input of each digital comparator is provided by a programmable register holding a threshold value.

It is one object of the invention to allow the comparators to be flexibly assigned to any one of the counters, thus allowing one counter to have up to the maximum number of provided threshold values or any number less than that maximum. The multiplexers and bus structure permit this assignment to be accomplished under the direction of the controller to which the counter module is attached, thus providing an effective degree of programmable flexibility to the counter structure.

The outputs of the comparators may be linked by an AND/OR gating circuit to provide an output, indicating whether a particular counter output is within a range defined by two or more threshold values.

It is thus another object of the invention to provide an additional degree of independent processing of the count value, and thus to free the controller from the simple, but time consuming, Boolean operations necessary to generate a signal indicative of a range and defined by a combination of threshold values. The use of an AND/OR gating circuit provides a high degree of flexibility in constructing that range.

The multiplexers may be controlled by data in associated registers and these registers and the registers holding the threshold values may be written to by the controller. The counter may be configured by data words held in a number of data blocks transmitted to these registers where each data block is associated with each comparator pair, as joined by an AND/OR gating circuit. A first word of the data block indicates a first threshold value for the first comparator of the AND/OR gating circuit, and a second word indicates a second threshold value for the second comparator of the AND/OR gating circuit, the second threshold value together with the first threshold value defining the range output, and a third word indicates from which independent counter, or counters, the counter output will be received by the first and second comparators.

Thus, it is yet another object of the invention to provide a natural command structure for changing the architecture of a hardware counter in response to commands from a controller.

The foregoing and other objects and advantages of the invention will appear from the following description. In the description, reference is made to the accompanying drawings which form a part hereof and in which there is shown by way of illustration, a preferred embodiment of the invention. Such embodiment does not necessarily represent the full scope of the invention, however, and reference is made therefore to the claims herein for interpreting the scope of the invention.

BRIEF DESCRIPTION OF THE DRAWINGS

FIG. 9 is a pictorial representation of a data block used to configure the counter module of FIG. 1; and FIG. 10 is a timing diagram showing the relative timing of the signals used to control the counters of FIG. 5.

DESCRIPTION OF THE PREFERRED EMBODIMENT

Figure 1:
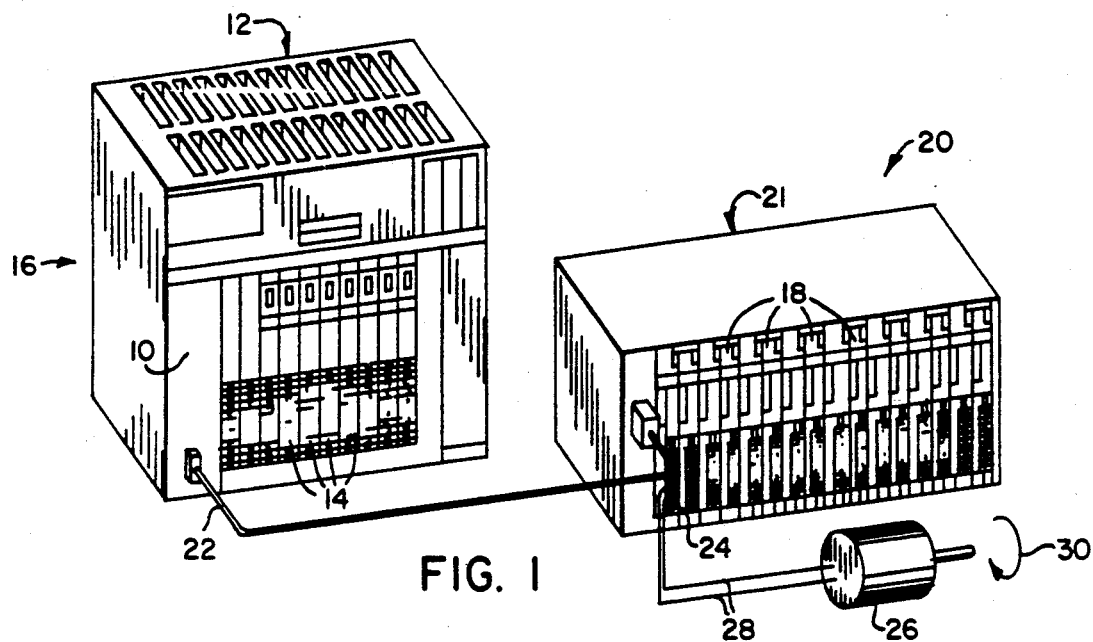
FIG. 1 is a pictorial view of an industrial controller communicating with a remote rack of I/O modules including the counter module of the present invention.

Referring to FIG. 1, an industrial control system suitable for use with the counter circuit of the present invention includes a programmable controller 10 communicating through a backplane 12 with adjacent I/O modules 14 within a rack 16. Additional remote I/O modules 18 may be contained within one or more remote I/O racks 20 connected to the programmable controller 10 via a serial remote I/O link 22. The programmable controller 10 sequentially addresses each remote I/O rack 20 and the modules 18 contained therein. Within each remote rack 20, the data of the serial link 22 is decoded and transmitted along backplane 21 to communicate with each of the modules 18.

The remote I/O racks 20 may be located up to 5000 feet from the programmable controller 10. A programmable controller with remotely located I/O racks is disclosed generally in Markley et. al. U.S. Pat No. 3,997,879, issued Dec. 14, 1976 and entitled: "Fault Processor for Programmable Controller with Remote I/O Interface Racks."

The data throughput of the remote I/O link 22 is limited by its serial format. This limit of data throughput may be important for certain high speed I/O functions or when a large number of remote I/O racks require the scanning of many I/O addresses. Of particular importance are digital encoder or counter inputs whose high data rates may tax the data throughput of the link 22 if they transmit directly on the link 22, as described above.

A counter module 24, according to the present invention, serves to limit the data throughput required to support high data rate encoders or counters, by performing counting and range comparison functions at the module level, rather than at the controller level, i.e., through a program running on the programmable controller. The counter module 24 is received with other remote modules 18 into the remote rack 20, and may accept a pulsed DC or binary signal from a rotary encoder 26 or the like. As is generally understood in the art, the rotary encoder 26 produces two square wave signals along separate leads 28 whose relative phases indicate the direction of the rotation 30 of the shaft of the encoder 26 and whose number of square wave cycles indicate the number of degrees of rotation 30. Alternatively the counter module 24 may receive a single lead (not shown) from a sensor indicating simply a count magnitude without a count direction.

Figure 2:
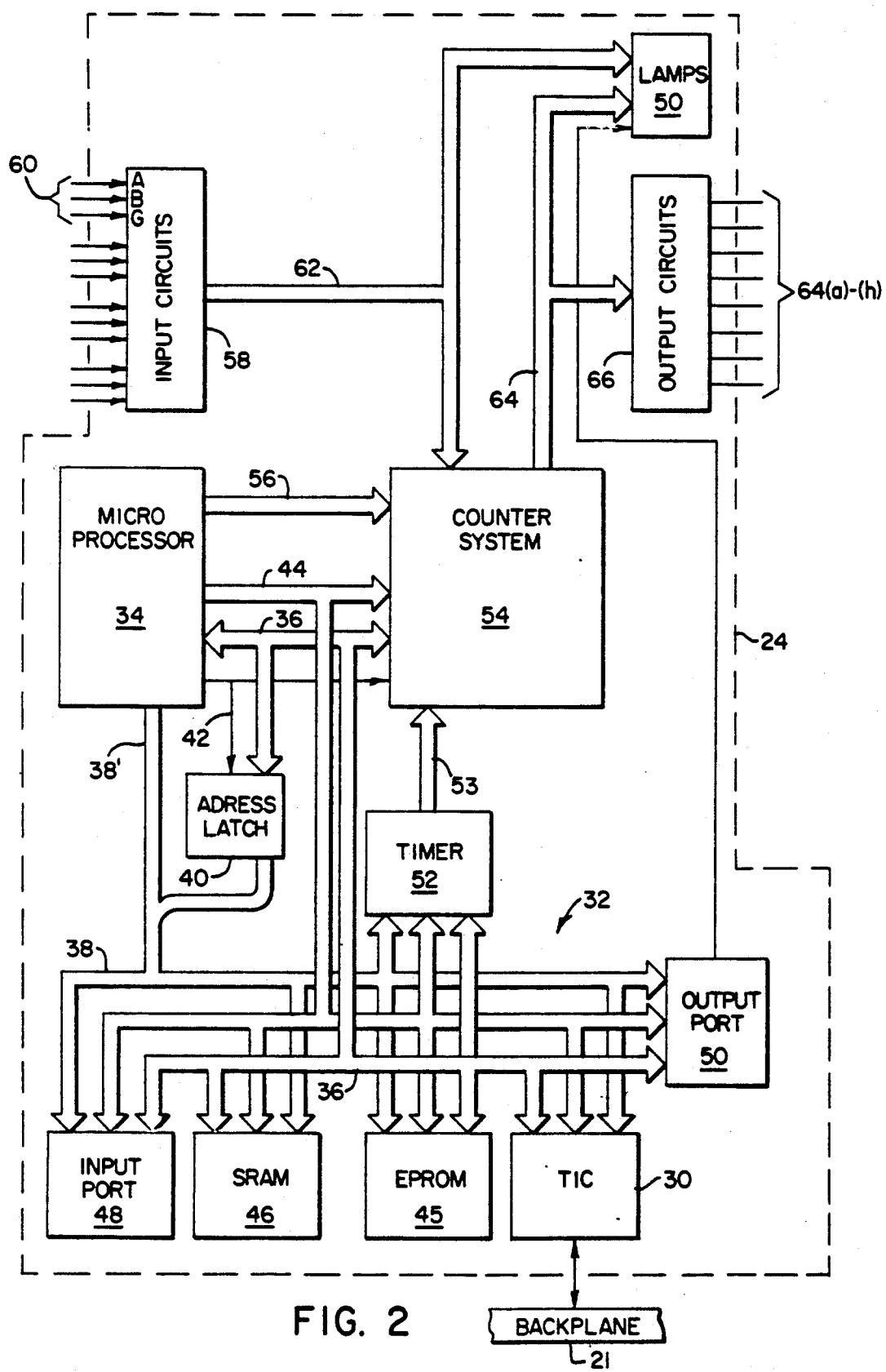
FIG. 2 is simplified schematic of the counter module of FIG. 1 showing the interconnection of a controlling microprocessor with the counter system circuitry.

Referring to FIG. 2, the counter module operates under the control of an on-board microprocessor 34. Microprocessor 34 is a general purpose sixteen-bit microprocessor, such as the Intel 80C188, which provides eight bi-directional data lines 36, eight dedicated address lines 38', and a variety of control lines 44 and 56.

The address lines 38' comprise the higher ordered eight bits of a sixteen bit address field. The lower ordered eight bits of the sixteen bit address field are provided by the data lines 36, which are multiplexed to include both data and address information, and decoded by address latch 40, receiving data lines 36 and address enable line 42, to latch the lower eight bits of the address field, as is generally understood in the art; and, when combined with address lines 38, to produce sixteen bits of address 38.

The sixteen address lines 38 form one-third of an internal bus 32. Data lines 36 make up an additional third of the internal bus 32, and control lines 44, providing read/write timing signals and clock signals, such as are generally understood in the art, make up the final third of the internal bus 32.

The internal bus 32 provides a communications pathway between the various functional blocks of the counter module 24, to be described, and provides communications between these functional blocks and the programmable controller 10 via the backplane 21 and a TIC "chip" 30.

The TIC chip 30 handles the communication protocol necessary for receiving and transmitting data between the backplane 21 and the internal bus 32 for the counter module 24. A detailed description of a circuit for accomplishing these communication protocols, suitable for use with the present invention, is given in U.S. Pat. No. 4,937,777, assigned to the same assignee as the present invention.

The internal bus 32 also communicates with an erasable programmable read-only memory ("EPROM") 45, a static random access memory ("SRAM") 46, an input port 48, and an output port 50, each which may be addressed and read or written to by microprocessor 34 through address lines 38 and data lines 36. The EPROM 45 contains the "firmware" program executed by the microprocessor 34 in conjunction with the operation of the counter module 24, that operation to be described in detail. The SRAM 46 provides "scratchpad" storage space for data manipulated by the microprocessor 34, and provides storage areas that may be read by the programmable controller 10 through the TIC chip 30. The input port 48 optionally allows certain values to be input to the microprocessor 34 by programmable jumpers. The output port 50 allows the microprocessor 34 to display information on front panel indicator lamps 50, in particular, an indicator showing whether the counter module 24 is running properly or whether a fault has occurred, as is well understood in the art.

The internal bus 32 also communicates with a programmable timer 52 which provides a precise time base for the counter module 24 for period and rate measurement techniques, well known in the art, where the count value is gated by a user-defined time interval to yield an average frequency value, rather than simply a count total.

The microprocessor 34 also communicates with a counter system block 54 by means of data lines 36, control lines 44, the address enable line 42, and a chip select line 56, so as to control the counter system 54 and provide communication between the counter system 54 and the backplane 21, as will be described below. Address data is provided by the address information multiplexed on the data lines 36, as has been described, and by the chip select line 56 which serves in lieu of the higher order address lines 38' otherwise required.

The counter system 54 also receives inputs from input circuits 58. Input circuits 58 process the signals to be counted by the counter module 24 on lines 28 (shown in FIG. 1), and perform electrical isolation and filtering functions to make the input signals compatible with the logic levels of the counter module circuitry. An input circuit which may be used with the present invention is described in U.S. Pat. No. 4,275,307 assigned to the same assignee as the present invention and hereby incorporated by reference.

The input circuits 58 receive signals to be counted through four channels 60(a)(d) each channel having of three terminals termed "A", "B", and "G". As processed by the input circuits 58, the twelve input signals 62 are received by the counter system 54 and also received by the lamps 50, the lamps which indicate the binary state of each signal. The signal from a rotary encoder 26, for example, may be received by one channel 60; the rotary encoder 26 producing two phased signals received by the A and B inputs of the channel 60.

The counter system 54 also produces eight output signals 64(a) through 64(h), received by output circuits 66 and by lamps 50, which indicate the binary state of each signal 64. The output circuits 66 convert the logic level signals from the counter system 54 to switched outputs, which provide user accessible open or closed circuits depending on the state of the respective signal 64. An output circuit suitable for use with the present invention is described in U.S. Pat. No. 3,745,546 assigned to the same assignee as the present invention and also incorporated by reference.

Thus, the counter system 54 is generally integrated into the above described microprocessor architecture and may communicate with the backplane 21, the input circuits 58, or output circuits 66 through the various signal paths described above. The counter system 54 also receives a time signal 53 in the form of a periodic square wave of predetermined frequency from the timer 52, previously described.

The circuitry of FIG. 2 is assembled on a printed circuit board to which the various components are soldered. Counter system 54 is a custom large scale integrated circuit. Screw terminals, as are understood in the art, provide access to the input circuits and the output circuits, and the indicator lamps are light emitting diodes.

Figure 3:
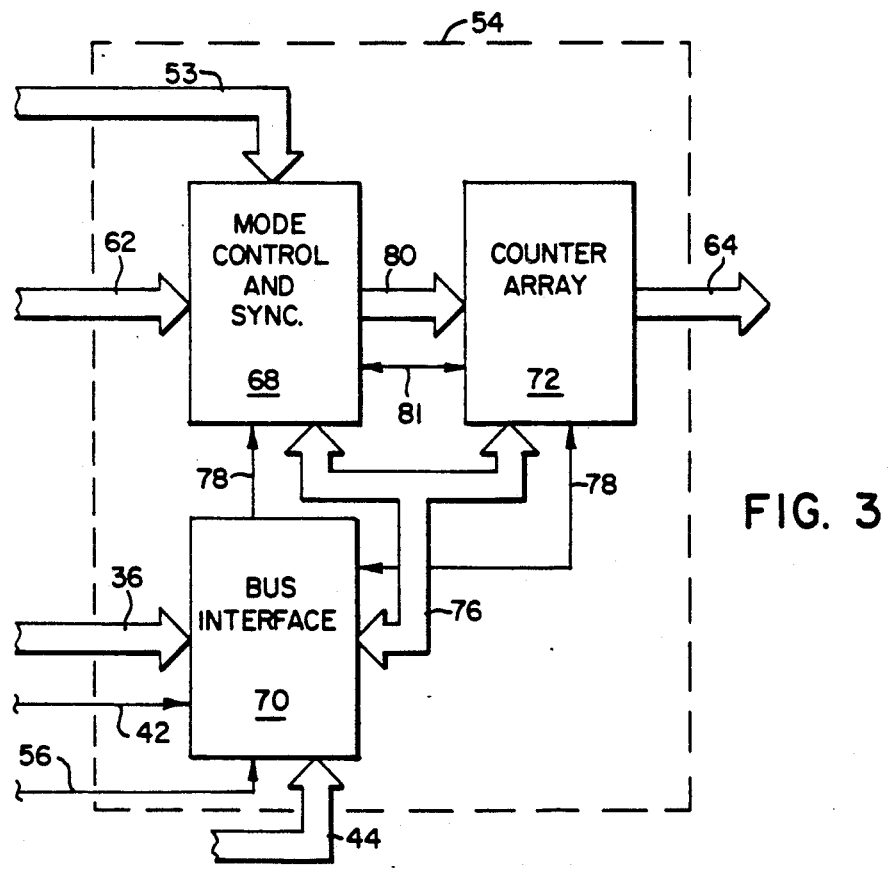
FIG. 3 is a simplified schematic of the counter system circuitry of FIG. 2 showing the data paths to and from the counter array.

Referring to FIG. 3, the counter system 54 receives the input signals 62 through mode control and synchronization circuitry 68 which serves two principle purposes. First, the input signals 62, derived from rotary encoders 26 or the like, as shown in FIG. 1, are generally asynchronous with respect to the internal timing of the counter module 24. The mode control and synchronization circuitry 68, therefore, is used to synchronize these input signals 62 to the internal timing of the counter module 24 by means of tandem, gating flip-flops (not shown) as is understood in the art. Second, the mode control and synchronization circuitry 68 provides timing and gating signals to permit the counter system to operate in a number of modes: In an encoder mode (1), the phased square wave signals from a rotary encoder 26 and received by inputs "A" and "B" (as shown in FIG. 2) are interpreted into a count-up signal or a countdown signal compatible with dual clocked counter, the latter of which will be described further below. In a counter mode (2), the A input is counted, and the B input determines whether the counter counts up or down in response to A. In a period/rate mode (3), the counter counts an internally generated four megahertz clock signal 53 (shown in FIG. 2), which is gated by the presence of a signal on the G input for the given channel 60. Thus, the count will reflect the time period of the gate signal. In a rate mode (4), a count at input A is counted for a period of time derived from the signal 53 from timer 52. The methods and techniques for providing these functions are well understood in the art, and for clarity, this circuitry will not be discussed further except with regard to certain timing signals which are required for the operation of the later described counters.

The mode control and synchronization circuitry 68 is controlled by instructions received by the microprocessor 34 via bus interface circuitry 70, which accepts the data lines 36, the address enable 42, the chip select line 56, and control lines 44 so as to communicate data between the microprocessor 34 and the counter system 54. Specifically, the combination of the data lines 36 and the address enable line 42 allows the various registers of the counter system 54 to be addressed, written to, and read from, without the need for separate, external pins carrying the lower ordered address. This provides a considerable savings in interconnecting pathways on the counter system chip 54 and allows the sharing of the same eight pins of the custom integrated circuit forming the counter system 54 for both address and data information.

The bus interface 70 also decodes the address information from the data that is multiplexed on data lines 36 and produces a set of enable signals 78 for controlling various registers, to be described, allowing new values to be entered into or read from those registers by the user, through the programmable controller 10—the registers serving generally to hold the configuration data for the counter array 72 and to store various count values.

A counter array 72, communicating both with the bus interface 70 and the mode control and synchronization circuitry 68, receives four pairs of dual clock signals 80 and certain control lines 81 from the mode control and synchronization circuitry 68, and receives an eight bit data bus 76 and corresponding control signals 78 from the bus interface 70. The data on the data bus 76 is identical to the data on data lines 36 of bus 32. The controls signals 78 enable various registers, as will be described.

The counter array 72 produces the eight output signal 64(a) through 64(h) from the counter system chip 54.

Figure 4:
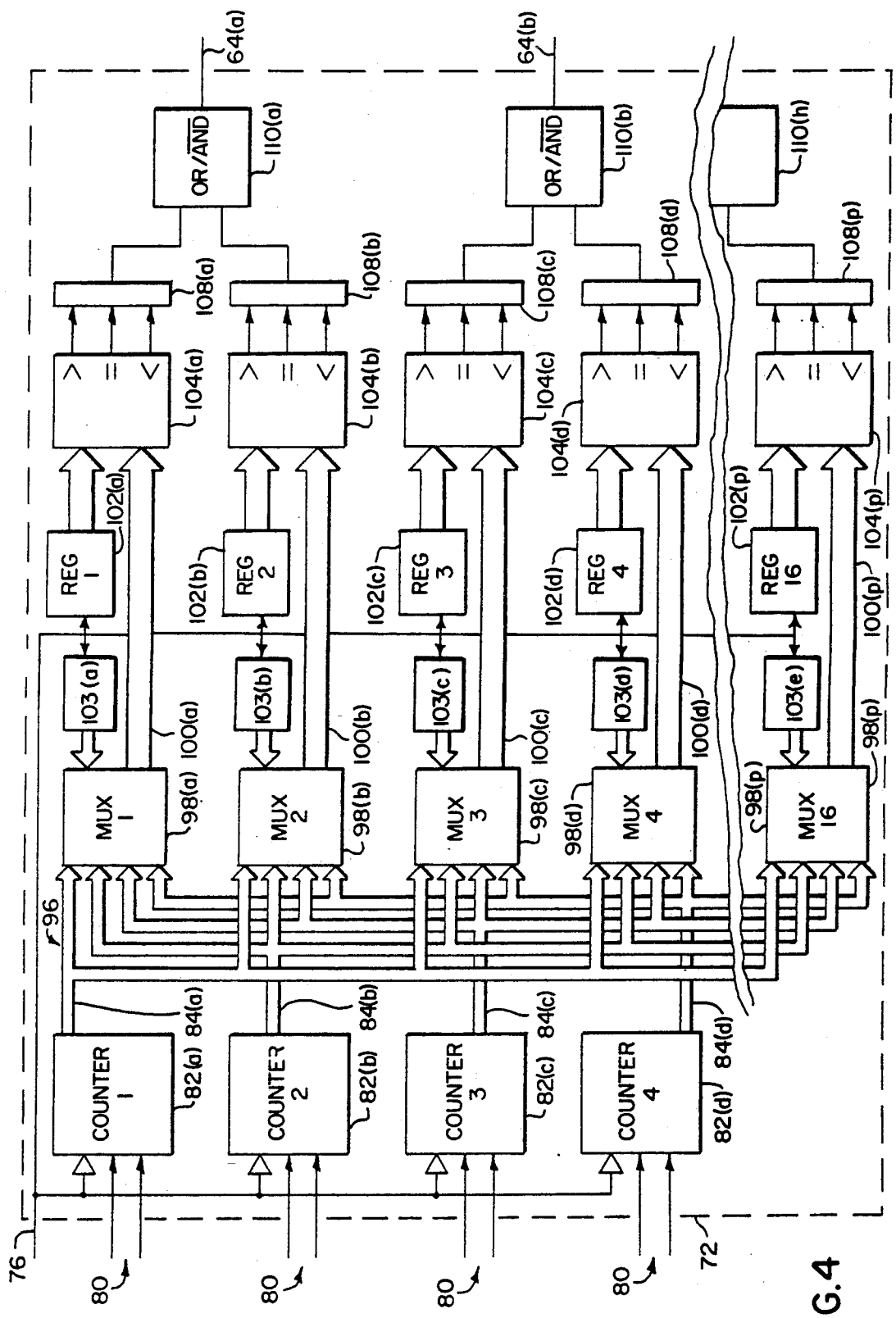
FIG. 4 is a simplified schematic showing the counter array of FIG. 3 and the bus architecture connecting a bank of independent counters with various outputs.

Referring now to FIG. 4, the architecture of the counter array 72 allows flexible interconnection among a number of functional blocks which together produce the desired counting function. These functional blocks are counters 82(a)-82(d), comparators 104(a)-104(d) and their associated registers, and AND/OR gating circuits 110(a)-110(h). The independent counters 82(a) through 82(d) each receives a separate dual clock signal 80, and each receives the internal data bus 76 and control lines 78 (not shown in FIG. 4 for clarity). Each dual clock input signals 80 consists of two lines, only one of which may receive a clock input at a time. The first line is a "count-up" line and indicates, as its name implies, that the counter is to increment its total count value. The second line of each dual clock signal 80 is the "countdown" line and indicates that the counter should decrement its total count value. This convention is well understood in the art.

Each counter 82(a) through 82(d) functions as a twenty-four bit up/down counter, with an adjustable modulus from zero to FFFFFF$_{16}$, to produce a twenty-four bit output count value 84(a) through 84(d). The twenty-four bit output count value 84(a) to 84(d) of each counter 82(a) through 82(d) is connected, by means of a counter output bus 96 comprised of four parallel twenty-four bit channels, to each of sixteen multiplexers 98(a) through 98(p). Each of these multiplexers 98 channels one of the twenty-four bit counter outputs 84 from the counter bus 96 to that multiplexer's single twenty-four bit output 100(a) through 100(p). The multiplexers 98 therefore operate as an effective, twenty-four-throw, four-pole switch connecting one of counter outputs 84 from counter 82(a) through 82(d) to its own output 100. The particular selection or pole position of each multiplexer 98 is determined by a value set in a register 103(a)-103(c), associated with each multiplexer and receiving a program word from the data bus 76 as addressed by the enable signal 78 from the bus interface 70.

Registers 102(a) through 102(p) are also connected to data bus 76 and receive a twenty-four bit threshold word as programmed by the user through the programmable controller 10. One register 102 is associated with each multiplexer 98.

The output of each counter 82(a) through 82(d), as transmitted by each multiplexer 98(a) through 98(p), is communicated to one input of a digital comparator 104(a) through 104(p), the other input of which receives the twenty-four bit threshold word contained in the corresponding register 102. Thus, for example, multiplexer 98(a) provides a twenty-four bit output word to one input of comparator 104(a), and the other input of 104(a) receives the twenty-four bit threshold word from register 102(a).

The comparators 104(a) through 104(p) produce three outputs, only one of which may be high at a given time depending on the inputs to the comparator 104 from the multiplexers 98 and the registers 102. These three outputs from the comparators 104 indicate respectively whether the output from the multiplexer 98 is greater than, is equal to, or is less than the threshold value in register 102. Each of these comparison outputs 106 is received by a three input switchable OR gate 108(a) through 108(p), constructed of three dual input and gates having outputs received by a three input OR gate, which logically OR's selected ones from among the three outputs of the comparators 104. The selected outputs, gated by the AND portions of the switchable OR gate 108(a) through 108(p), are determined by a value stored in a register (not shown) associated with each switchable OR gate 108(a) through 108(p), the register being loaded through the data bus 76 and ultimately by the user programming the programmable controller 10, as described above.

Thus, depending on the setting of the switchable OR gate 108, the output of the switchable OR gate 108 will be high if the counter output 84 selected by multiplexer 98 is larger than, is equal to, or is less than the threshold value in the register 102, or some combination of these conditions provided by the OR portion of the switchable OR gate 108.

The outputs from two switchable OR gates 108 are connected to one of eight AND/OR circuits 110(a) through 110(h), which may act as either an AND gate or as an OR gate, as controlled, and also by a register (not shown), as programmed by the user through the programmable controller 10. Thus, the outputs of each pair of switchable OR gates 108(a) and 108(b) are connected to a single AND/OR gating circuit 110. The outputs of the eight AND/OR gating circuits 110(a) through 110(h) are the outputs 64(a) through 64(h) of the counter array 72, as previously described. This matching of two switchable OR gates 108 to one AND/OR gating circuit 110 is continued for each of the switchable OR gates 108(a) through 108(p), producing eight output signals 64 corresponding to eight AND/OR gating circuits 110(a) to 110(h).

Figure 5:
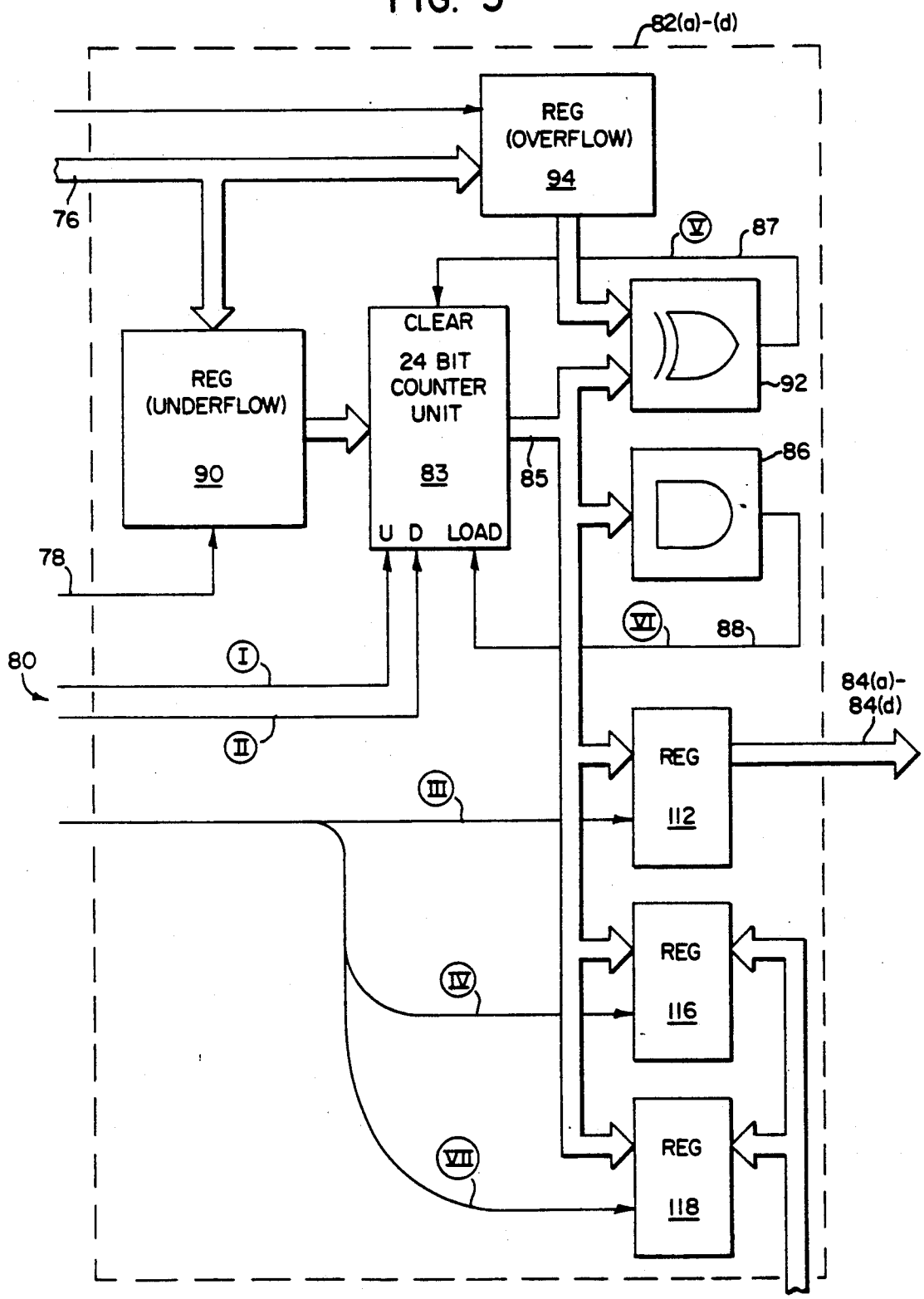
FIG. 5 is a block diagram of each of the counters of FIG. 4.

Referring to FIG. 5, each counter 82(a) through 82(d) of FIG. 4 is constructed around a twenty-four bit, loadable, up/down counter unit 83 receiving dual clock lines 80, a load line 88 for loading its count value, and a clear line 93 for setting the count value of counter 83 to zero. The counter unit produces a twenty-four bit counter output 85. The twenty-four bit counter unit 83 is functionally equivalent to a counter comprised of six synchronously connected four bit TTL counters such as the Texas Instrument 74192, as described in the "TTL Databook For Design Engineers", Second Edition, Published by Texas Instruments, Inc., hereby incorporated by reference.

The adjustable modulus feature of the counters 82(a) through 82(d) is realized as follows: An underflow, that is, when the counter 83 is counting down and its count value becomes $FFFFFF_{16}$, is detected by an AND gate circuit 86 which receives the output 85. The AND gate circuit 86, detecting the zero state of the counter output 85 produces a load signal on load line 88 that causes the counter unit 83 to load an underflow value from register 90, as determined by the user and loaded in register 90 through the programmable. controller 10. The underflow value in register 90 is equal to one less then the desired modulus of the counter 82. Thus, when counter unit 24 underflows, it receives the underflow value contained in register 90 rather than underflowing to its maximum count value of $FFFFFF_{16}$.

The output of counter unit 83 is also received by EXCLUSIVE OR gate circuit 92, which compares that output to an overflow value held in register 94, as determined by the user.

The overflow value held in register 94 is exactly one more than the underflow value held in register 90. Thus, when the output of the counter unit 83 equals the overflow value contained in register 94, a clear signal is created on the clear line 78 which resets the counter unit 83 to zero.

As with the other registers, registers 90 and 94 are connected to the data lines 76 and enabling control lines 78 so that their values may be loaded from the programmable controller 10 via the remote link 22, through the TIC chip 30 and the internal bus structure of the counter module 24, as previously described. It will be understood from this description that an arbitrary modulus for the counter 82 through 82(d) may be thus established simply by programming the registers 90 and 94 with underflow and overflow values respectively.

Referring still to FIG. 5, it is noted that the overflow value held in register 94 is in fact one greater than the maximum value counted to by the counter unit 83, given the desired modulus of the counter unit 83. As a result of the intrinsic gates delays of the EXCLUSIVE OR gate circuit circuit 92, which detects when counter unit 83 has reached the count indicated by the value of register 94, for a brief period of time, the counter unit 83 will output a spurious count value 85. For similar reasons during an underflow of counter unit 83 and because of the intrinsic gate delays of AND gate circuit 86 during an underflow condition, the counter unit 83 will display its maximum count of $FFFFFF_{16}$ prior to being loaded with the underflow value in register 90 per the defined modulus of counter 83.

Accordingly, the outputs of the counters 84(a) through 84(d) in fact come through a register 112, which is gated so as to ignore any spurious transitional values from counter unit 83. Referring also now to FIG. 10, the count-up or countdown signals "I" or "II" are synchronized, as previously described, with an eight Mhz clock signal 114 from an onboard clock (not shown). During a count-up, as shown in FIG. 10, the countdown signal II is high and the output of counter 83 is incremented on the rising edge of the count-up signal I. A latch signal "III" for register 112, produced by the mode control and synchronization circuitry shown in FIG. 68, is delayed for one clock period of the eight Mhz clock. In between the rising edges of the up count signal I and the rising edge of latching signal III for register 112, signals "VI" or "V", indicating underflow or overflow condition and generated by AND gate circuit 86 or EXCLUSIVE OR gate circuit 92, if an overflow or underflow exists for the given count, will produce a pulse with a rising edge prior to the rising edge of signal III.

This signal VI or V loads or clears the counter unit 83 as has been described, prior to the rising edge of the latch signal III.

Two additional registers 116 and 118 store counter output values 85. Register 116 is triggered by signal IV, similar in timing to signal III, and allows reading of the output 85 by microprocessor 34 without interruption of the outputs 84(a)–84(d). Register 118 is used to capture a particular count value as triggered by signal VII derived from the G input of input circuit 58 (shown in FIG. 2) and as processed by the mode control and synchronization circuitry of 68 of FIG. 3. Register 118 is generally triggered asynchronously with respect to register 116 but is delayed with respect to the signals I or II, like registers 112 and 116, to insure that no spurious output values 85 are captured by these registers. The outputs of these registers 116 and 118 may be accessed by the user through the programmable controller 10 and microprocessor 34 by means of the internal data bus 76.

Accordingly, referring to FIG. 4, it will be understood that the user may program a number of features of the counter array 72: 1) the modulus of each counter 82 may be controlled separately; 2) by virtue of the multiplexers 98(a) through 98(p) the output of each counter may be associated with any output signal 64; and 3) each output 64 may have a "turn on" and "turn off" point anywhere within the modulus of its associated counter 82. It should be understood, also, that a given output signal 64 may be associated with either one or two counters. That is, optionally, the "turn on" point may be determined by one counter, and the "turn off" point may be determined by a second counter.

Figure 6:
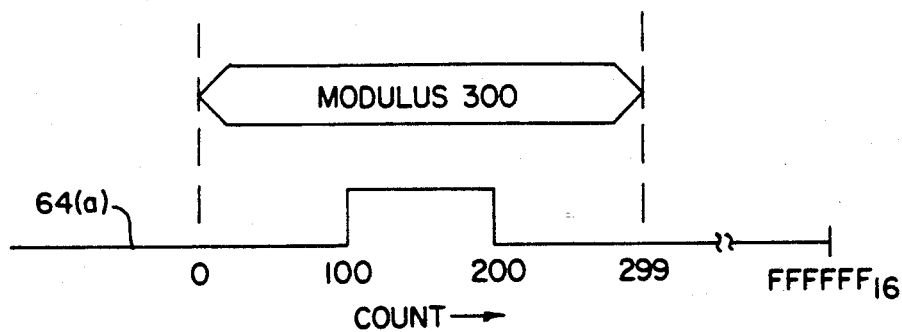
FIGS. 6, 7, and 8 are graphs showing various examples of outputs from the counter module of FIG. 1.

Referring to FIG. 6, the modulus of a counter 83 may be set to 300 by programming register 90 shown in FIG. 5 with 299 and register 94 shown in FIG. 5 with 300. The counter 82 associated with those registers will then count between the values of zero and 299.

Output 1 may be associated with that counter 82 by loading the appropriate values in the registers associated with multiplexers 98(a) and 98(b) so that, for example, the output of counter 82(a) is switched to comparator 104(a) and 104(b). If it is desired that output 64(a) turn on beginning at count 100, register 102(a) may be loaded with the value 100 and both the "greater than" and "equal" bits set with regard to the register controlling the switchable OR gate 108 to detect the greater than OR equal condition. Alternatively, register 102(a) may be loaded with the value of 99 and only the greater than bit set in switchable OR gate 108(a).

If it is then desired that the output turn off at count 200, register 102(b) may be loaded with the value 200 and the "greater than" and "equal" bits set in register controlling the switchable OR gate, or alternatively, register 102(b) may be set with the value 199 and the "greater than" bit set. In either case the AND/OR circuit 110 will be configured by the user for the AND configuration so that the output 64 is on when the count is greater then 100 and less then 200.

Figure 7:
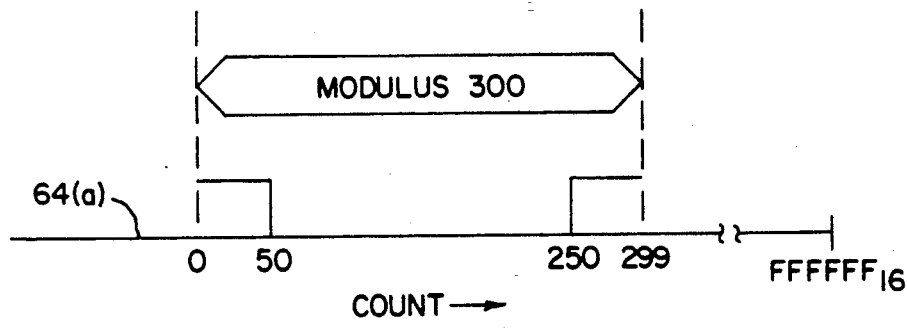

In a second example shown in FIG. 7, the output may be set so that it turns off when the count is greater than 50 and then on again when the count is greater than 250. Here register 102(a) may be loaded with the value 50 and the "greater than" and "equal" bits set on the register associated with the switchable OR gate 108(a). Register 102(b) may be set with the value 250 and the "less than" and "equal" bits set with respect to the switchable OR gate 108(b). Here the AND/OR circuit 110(a) would be configured in the OR mode so that the output 64(a) is on when the count is less than or equal to 50 or greater than or equal to 250.

Figure 8:
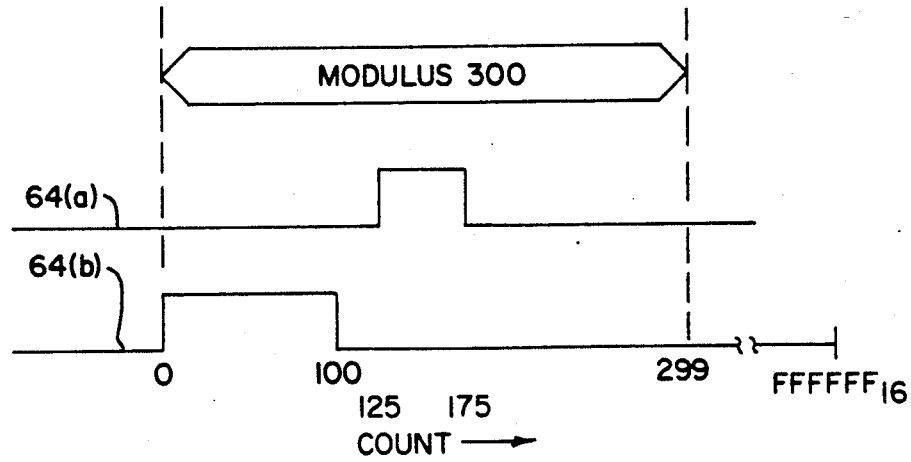

Importantly, two or more outputs 64 may be configured to be associated with a single counter 82. In FIG. 8, output 64(a) is configured to turn on when the count is greater than 125 and turn off when the count is greater than 175, whereas output 64(b) is configured to turn on when the count is greater than 5 and less than 100. In this case multiplexer 98(a), (b), (c), and (d) are all configured to select the same counter 82(a) so that both outputs 64(a) and outputs 64(b) may indicate the state of that counter 82(a).

Referring to FIG. 2 and 9, each of these above described configurations and many other configurations of the architecture of counter module 24 are programmed simply by a data block 120 held in SRAM 46, as loaded by the user through the programmable controller 10. Each of the eight outputs 64 of the counter module 24 has five data words 122 associated with it. The first four bits of the first data word 122 for each output 64 indicate which of the four counters 82(a) through 82(d) is associated with that output 64. Only one bit of the first four bits in this first data word 122 may be set. The next two data words 122 contain the most significant bits and least significant bits of the twenty-four bits to be loaded into the first register 102 associated with that output 64. These bits are termed the "on bits", referring to the example of FIG. 6 where these bits determine the point at which the output turns on. The next two data words 122 are the most significant bits and least significant bits of the twenty-four bit "off word" which is loaded into the second register 102(b) associated with that output 64. This data block 120 is repeated for each of the eight outputs 64.

Referring generally to FIG. 2, it can be seen that this simple data structure and the particular functional division of the counter array 76 as described above allows virtually unlimited flexibility in configuring the eight outputs 64 among the four counters 82. For example, all eight outputs 64 may read one counter 82, providing a set of staggered or overlapping digital outputs dependant on the value in that counter 82. Conversely, the eight outputs 64 may be distributed among the four counters 82 providing each counter with two outputs 64. Many other combinations are possible.

The functional division of the counters 82 from the output comparators 104, and from the AND/OR gating circuits 110 and the use of the bus structure 96 for connecting any output 64 to any counter 82, thus provides a high degree of flexibility in configuring a counter module 24 to a particular process, yet still allows the high speed performance associated with a hardware implementation of the counting function.

A preferred embodiment of the invention has been described, but it should be apparent to those skilled in the art that many variations can be made without departing from the spirit of the invention. For example, the number of counters and outputs may be increased within the architecture described above. In order to apprise the public of the various embodiments that may fall within the scope of the invention, the following claims are made.

I claim:

1. A high speed counting unit comprising:
   a plurality of independent counters each having an input for receiving a count signal and each having a counter output indicating a total count value;
   a plurality of first registers each for holding a counter address;
   a plurality of multiplexers, each multiplexer having plural multiplexer inputs communicating with each of the independent counters to receive the counter outputs, and address input for receiving a one counter address, and each multiplexer for selectively communicating at least one counter output to a multiplexer output for that multiplexer as designated by one counter address;
   a plurality of second registers corresponding in number to the multiplexers, each register for holding a threshold value; and
   a plurality of comparators corresponding in number to the multiplexers, each comparator communicating with a second register for receiving the threshold value from that second register as a first input and communicating with the multiplexers for receiving the multiplexer output from that multiplexer as a second input, the comparator for producing a threshold output dependant on the relative magnitudes of the first and second inputs.

2. The high speed counting unit as recited in claim 1 including:
   a plurality of AND/OR gating circuits communicating with at least two comparators for receiving the threshold outputs from those comparators for producing a range output depending on a Boolean combination of the threshold outputs.

3. The high speed counting unit as recited in claim 1 wherein the comparators comprise:
   a magnitude comparator unit for receiving the first and second input and for producing three outputs indicating respectively when the first input is greater than, equal to and less than the second input; and
   a gated input three input OR circuit for receiving the three outputs and for producing a signal that is the logical OR of at least one of the three output signals.

4. The high speed counting unit as recited in claim 1 wherein the counters are variable modulus up/down counters.

5. A data structure for controlling a high speed counting unit, the counting unit having:
   a plurality of independent counters, each having an input for receiving a count signal and each having a counter output indicating a total count value;
   a plurality of first registers each for holding a counter address;
   a plurality of multiplexers, each multiplexer having plural multiplexer inputs communicating with each of the independent counters to receive the counter outputs, and each multiplexer for selectively communicating at least one counter output to a multiplexer output for that multiplexer as determined by one first data register;

a plurality of second registers corresponding in number to the multiplexers, each register for holding a threshold value; and a plurality of comparators corresponding in number to the multiplexers, each comparator communicating with a register for receiving the threshold value from that register as a first input and communicating with the multiplexers for receiving the multiplexer output from that multiplexer as a second input, the comparator for producing a threshold output dependant on the relative magnitudes of the first and second inputs a plurality of AND/OR gating circuits communicating with each first and second comparator for receiving the threshold outputs from those comparators and for producing a range output depending on a Boolean combination of the threshold outputs, the data structure comprising:

a multi-word data block for each first and second comparator, the data block having a first word indicating a first threshold value for the first comparator and a second word indicating a second threshold value for the second comparator, the second threshold value together with the first threshold value defining the range output, and a third word indicating from which independent counter the counter output will be received by each first and second comparators, the data block for transmission to the plurality of first and second registers of the high speed counter.

* * * * *